(12) United States Patent
Ostmann et al.

(10) Patent No.: US 8,654,536 B2
(45) Date of Patent: Feb. 18, 2014

(54) EXPANDABLE CIRCUIT CARRIER

(75) Inventors: Andreas Ostmann, Berlin (DE); Manuel Seckel, Berlin (DE); Thomas Löher, Berlin (DE); Dionysios Manessis, Berlin (DE); Rainer Patzelt, Berlin (DE)

(73) Assignee: Fraunhofer-Gesellschaft zur Forderung der Angewandten Forschung E.V., Munich (DE)

( * ) Notice: Subject to any disclaimer, the term of this patent is extended or adjusted under 35 U.S.C. 154(b) by 1067 days.

(21) Appl. No.: 11/940,640

(22) Filed: Nov. 15, 2007

(65) Prior Publication Data

US 2008/0257589 A1    Oct. 23, 2008

(30) Foreign Application Priority Data

Nov. 21, 2006  (DE) .......................... 10 2006 055 576

(51) Int. Cl.
*H05K 1/00*        (2006.01)

(52) U.S. Cl.
USPC ........... 361/749; 361/737; 361/764; 361/782; 174/520

(58) Field of Classification Search
USPC ................. 361/763–764, 782–784, 736–737; 174/520–523
See application file for complete search history.

(56) References Cited

U.S. PATENT DOCUMENTS

| 4,829,666 | A  | * | 5/1989  | Haghiri-Tehrani et al. ..... 29/841 |
| 5,365,655 | A  | * | 11/1994 | Rose ................................. 29/827 |
| 6,088,230 | A  | * | 7/2000  | Finn et al. ...................... 361/737 |
| 6,404,643 | B1 | * | 6/2002  | Chung .......................... 361/737 |
| 6,816,380 | B2 | * | 11/2004 | Credelle et al. ............... 361/736 |
| 2006/0231288 | A1 |  | 10/2006 | Vanfleteren et al. |

FOREIGN PATENT DOCUMENTS

| DE | 203 20 760 U1 | 4/2005 |
| JP | 06314877 A | 11/1994 |
| WO | 2004/107973 A1 | 12/2004 |

* cited by examiner

*Primary Examiner* — Tuan T Dinh

(74) *Attorney, Agent, or Firm* — Barnes & Thornburg LLP

(57) ABSTRACT

The present invention relates to a method for the production of an expandable circuit carrier in which a starting material for an expandable substrate is applied on an electrically conductive foil which forms an expandable substrate layer which is connected to the foil, after which the foil is structured such that it forms a conductor structure having at least one expandable strip conductor. The present invention further relates to an expandable circuit carrier which can be produced by the method.

4 Claims, 4 Drawing Sheets

EXPANDABLE CIRCUIT CARRIER

CROSS REFERENCE TO RELATED APPLICATIONS

Figure 1:
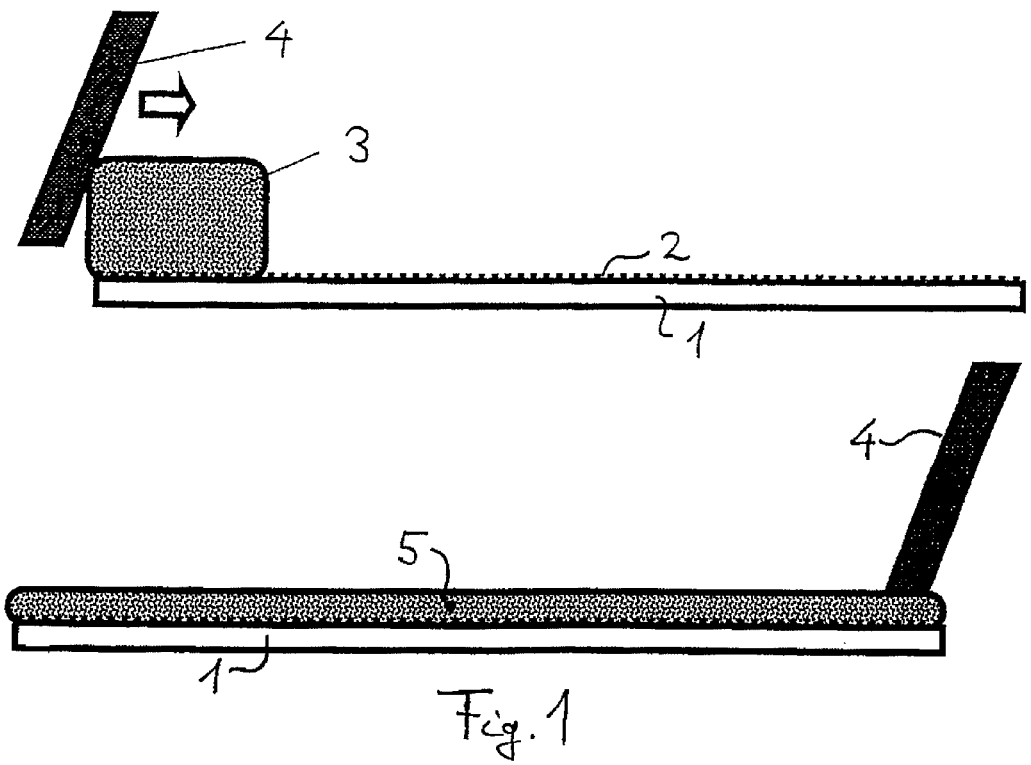
Figure 2:
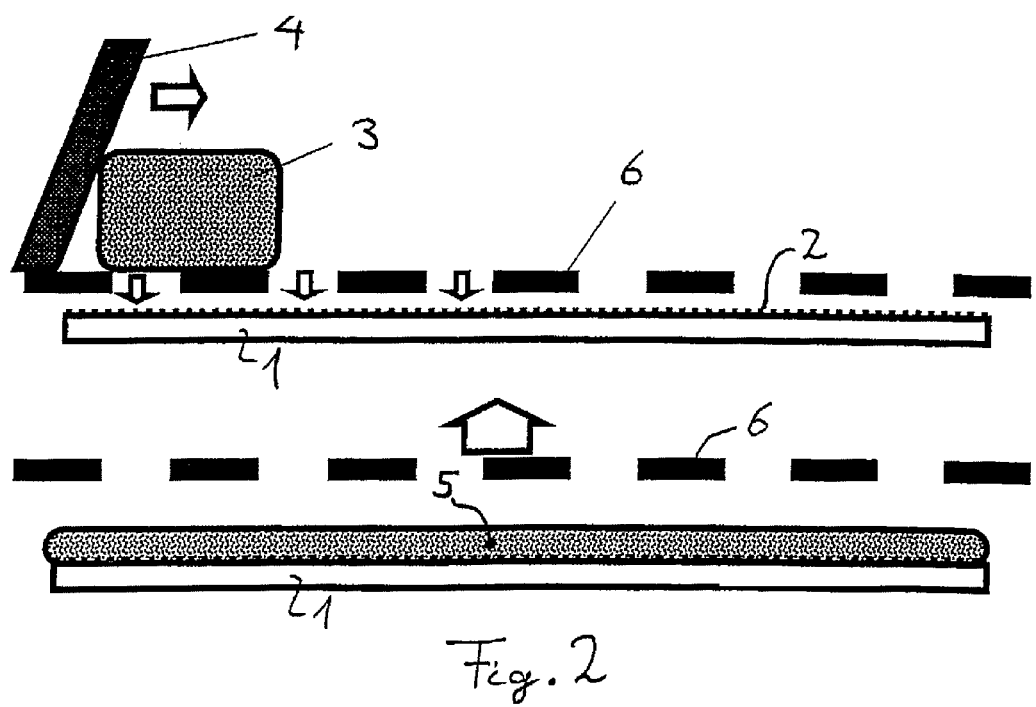

This Convention application claims the benefit of the Nov. 21, 2006 filing date of German Patent Application DE 10 2006 055 576.7-34. The entire disclosure of DE 10 2006 055 576.7-34 is hereby incorporated herein by reference.

The present invention relates to a method for the production of an expandable circuit carrier and also to a corresponding expandable circuit carrier.

Expandable circuit carriers can be applied in particular in the medical-technological field if it is necessary to dispose circuit carriers and possibly electronic components connected to the circuit carriers for example on or in a living body on surfaces with three-dimensional topography. Further applications can result by integration of circuit carriers in demanding designer environments, for example in vehicle interiors.

Expandable circuit carriers are known per se but have been characterised to date by an exceptionally complex production. It is therefore the object of the present invention to develop a method for the production of an expandable circuit carrier which enables a comparatively low-complexity and hence economical production of such circuit carriers. Furthermore, the object underlying the invention is to develop expandable circuit carriers which can be produced correspondingly easily and which, in addition to a conductor structure, also comprise at least one electronic component and can be stretched and relaxed again several times also without damage.

The proposed method can be implemented very easily in that a starting material for an expandable substrate is applied on a foil which is initially present all over, which material then forms an expandable substrate layer which is connected to the foil, i.e. adhering to the foil, after which the foil is structured such that it forms a conductor structure having at least one expandable strip conductor.

The substrate layer can thereby be formed by using a corresponding starting material which can comprise also a plurality of components, in particular a preferably thermoplastic polyurethane or silicone or rubber or latex or another expandable, rubber-like polymer. Formation of the expandable substrate layer can take place thereby by curing, for example cross-linking or binding, of the starting material in which the latter is transferred into an expandable final state. The curing can be triggered thermally or chemically in various embodiments of the invention. In a particularly simple case, a thermoplastic starting material is used to form the substrate layer, said starting material being cured by cooling and being transferred into its expandable final state.

The expandable substrate layer can thereby obtain for example a preferably uniform thickness of between 25 μm and 1 mm, an advantageously slight expandability in particular being able to be produced when the ability to be stressed is not too small, when the expandable substrate layer is configured with a thickness of between 25 μm and 200 μm. In the described manner, it is possible without difficulty to produce a substrate layer and hence a circuit carrier which can be expanded by at least 10%, preferably by at least 50%, i.e. to at least 110% or 150% of an initial length, multiple expansion and relaxation of the circuit carrier also having no damaging effects.

The starting material for forming the expandable substrate layer can be applied in a simple manner by knife coating or printing, in particular by screen printing, which can be implemented in turn with the help of a knife or by casting or laminating onto the foil. In the case of application of the starting material by lamination, the starting material can be applied for example in the form of powder or even in foil form onto the foil which forms the conductor structure in order then to be connected preferably under the effect of pressure and/or temperature—for example by means of a roller (by roller lamination)—to the conductive foil.

In order to achieve better adhesion of the expandable substrate layer on the conductive foil, the foil can be roughened chemically or mechanically and/or oxidised before application of the starting material on a surface which is orientated subsequently towards the substrate layer.

The conductive foil, which can be formed with respect to good conductivity from copper or even from gold or silver or a different metal, can be chosen, with respect to the smallest possible dimensions of the circuit carrier with not too great sensitivity of the at least one strip conductor, for example with a thickness of between 5 μm and 100 μm. Structuring of this foil for forming the conductor structure can take place thereby in any manner known per se, for example by photolithography. In order to ensure that the at least one strip conductor is expandable, it can be provided that the strip conductor thereby obtains a course which is curved alternately in oppositely situated directions from a main conductor direction, i.e. typically an undulating, zigzag or meandering course. In order to avoid breakage of the at least one strip conductor upon expansion of the thus produced circuit carrier, changes in direction of the course of the strip conductors should thereby be formed as rounded as possible.

It can be provided that, after structuring of the foil, a second expandable layer which covers the conductor structure is applied on the conductor structure and on exposed regions of the first mentioned expandable substrate layer which consequently, together with the expandable substrate layer, forms a substrate in which the conductor structure is situated embedded and thus protected. In order to produce the second expandable layer, again all the materials mentioned further back as possible starting materials for the expandable substrate layer can thereby be used. The same or a different material can thereby be used as for the expandable substrate layer. For application of the corresponding material, the already mentioned methods are possible, i.e. in particular printing, knife coating, casting or lamination.

Typically, the conductor structure, in addition to the at least one strip conductor—normally a plurality of expandable strip conductors will be provided—will comprise also terminal faces which are suitable for contacting electronic components to be connected to the conductor structure. It is thereby particularly advantageous if, in addition to the strip conductors with the terminal faces which are typically connected respectively to an expandable strip conductor, reinforcing structures are structured into the foil and reinforce the substrate layer in the vicinity at least of two terminal faces without connecting these terminal faces to each other electrically. Mechanical overloading of electrical connections between the terminal faces and terminals of an electronic component which is contacted by the terminal faces and damage to these connections which interrupts the contact can thereby be avoided. The reinforcing structures can thereby concern for example reinforcing pads or reinforcing faces which are disposed in the vicinity of the corresponding terminal faces and preferably are insulated all around.

An advantageous embodiment of the method provides that the thus produced circuit carrier comprises at least one electronic component which is connected to the conductor structure and thus forms an expandable complex electronic structure. Various electronic components can thereby be used, for example active or passive surface-mounted components or integrated circuits which are mounted in flip chip technology. The at least one electronic component can also concern a sensor.

Such an electronic component can be integrated in different ways into the expandable circuit carrier. For example, it can be provided that the conductor structure is fitted, after structuring of the foil, with the at least one electronic component, a connection to the conductor structure being able to take place in a manner known per se, for example by means of a conductive adhesive. In this case, it is particularly advantageous if subsequently a second expandable layer which covers the conductor structure is applied, into which also the at least one electronic component can then be embedded partially or completely. In order to protect contactings between the electronic component and the conductor structure from overloading during expansion of the expandable circuit carrier, the electronic component can be surrounded after contacting with the conductor structure with a material which connects the electronic component to the expandable substrate layer and to the conductor structure in the vicinity of the electronic component and which possibly after curing is more rigid than the expandable substrate layer. For this purpose, the mentioned material can be cast for example around the electronic component. The mentioned second expandable layer can possibly be applied subsequently. Also the mentioned more rigid material will thereby normally be provided by a polymer.

If the conductor structure is fitted in the described manner after structuring of the foil with the electronic component or plurality of electronic components and if a subsequently applied second expandable layer which covers the conductor structure is provided, it can be advantageous to apply the second expandable layer at a lower temperature than the starting material which forms the substrate layer. Thus it can be provided for example to use a thermoplast of a melting temperature of greater than 200° C. as starting material for the expandable substrate layer, whilst the second expandable layer is formed from a thermoplastic plastic material with a melting temperature of less than 130° C. It can consequently be achieved that, on the one hand, the expandable substrate layer is not damaged during fitting of the conductor structure with the electronic component—even when a soldering process for example is implemented for this purpose—whilst, on the other hand, damage to the connection of the electronic component to the conductor structure is prevented by the lower temperature during application of the second expandable layer. In this respect, it is particularly advantageous if the expandable substrate layer can withstand temperatures of approx. 200° C. without damage whilst the second expandable layer is applied at a temperature of at most 130° C.

Another method for producing an expandable circuit carrier having at least one electronic component provides that, even before application of the starting material on the foil, the at least one electronic component is disposed on the foil and connected to the foil such that at least one electronic component is embedded at least partially in the resulting expandable substrate layer during application of the starting material, the starting material requiring to cover the electronic component preferably completely. A conductive connection of terminals of the electronic component to the foil can thereby be produced again in a manner known per se, for example by adhesion with a conductive adhesive or also by soldering on or welding on, in particular pressure welding or diffusion bonding. In an advantageous manner, even during application of higher temperatures when connecting the electronic component to the foil, no damage to the expandable substrate layer can thereby be effected because the latter is only applied later. Structuring of the foil for producing the conductor structure takes place in contrast again only after application of the expandable substrate layer, the conductor structure being able to be protected in turn in that subsequently another second expandable layer which covers the conductor structure is applied.

If in the method described in the previous paragraph the at least one electronic component which is disposed on the foil is surrounded before application of the starting material for forming the expandable substrate layer with a material which connects the electronic component mechanically to the foil and which—possibly after curing—is more rigid than the expandable substrate layer, protection of contactings between the electronic component and the subsequently produced conductor structure can again be avoided in a simple manner. In the case of an advantageous embodiment of the method, it can be provided that the foil is provided, before arrangement of the at least one electronic component on the foil, with for example position markings and/or with orientation borings which are provided for example by recesses, for example by a treatment with laser radiation, after which the at least one electronic component is disposed on the position markings and/or in a defined position relative to the orientation borings. This can facilitate correct arrangement of the electronic component or the electronic components in view of the fact that the conductor structure is then not yet completed. Suitably formed position markings can thereby effect—in particular during a soldering process—advantageously also self-centring of the electronic component during connection to the foil. Orientation borings which penetrate the foil completely or at least are detectable on a rear side of the foil can furthermore serve advantageously as orientation during structuring of the foil for forming the conductor structure.

In certain circumstances it is also possible to combine the two different methods which are described for integrating electronic components in or on an expandable circuit carrier substrate such that an electronic component or a plurality of electronic components are connected before application of the starting material for forming the expandable substrate layer to the still unstructured foil and subsequently are embedded in the expandable substrate layer whilst at least one further electronic component is connected after structuring of the foil on the opposite side to the conductor structure and possibly is covered by a second expandable layer.

Irrespective of the chosen method, finally terminals of the at least one electronic component can be connected not only directly but also by means of a conductive expandable material to terminal faces (termed pads) of the conductor structure. In the case of assembly of the electronic component on the still unstructured foil, this can take place in turn before application of the starting material for the expandable substrate layer—this is necessary in particular in the case where the electronic component has terminals orientated away from the foil—or after structuring of the foil. A consequently achieved elastic contacting of the electronic component can help to avoid damage to the conductive connection of the electronic component to the conductor structure during expansion of the expandable circuit carrier. The conductive expandable material can concern for example a rubber-like plastic material which is filled with conductive particles or fibres.

Particularly advantageous expandable circuit carriers which can be produced for example in the described manner consequently comprise an expandable substrate, a conductor structure, which is embedded in the substrate or is disposed on a surface of the substrate, having expandable strip conductors, and comprise at least two terminal faces which are connected respectively to one of the strip conductors and also at least one electronic component which has terminals which are connected to the terminal faces in an electrically conductive manner, the conductor structure having reinforcing structures which reinforces the circuit carrier in the vicinity of the terminal faces which are connected to the at least one electronic component without connecting the terminal faces electrically, and/or the at least one electronic component being surrounded by a material which connects it mechanically to the conductor structure and is more rigid than the material which forms the expandable substrate, and/or at least one of the terminals of the at least one electronic component being connected to the corresponding terminal face by means of a conductive expandable material.

The mentioned features thereby serve in particular for the purpose of preventing contactings between the at least one electronic component and the conductor structure from being damaged even upon a possibly multiple expansion and relaxation of the expandable circuit carrier. Such an expandable circuit carrier can of course have in addition all the possible combinations of the features which result from the above-described embodiments of the corresponding production method.

Expandable circuit carriers of the just described type can finally form even completely expandable autonomous electronic whole systems—for example comprising sensor, processor, data transmission means and energy supply—and in particular can be particularly advantageous if data processing is intended to be effected as close as possible to a sensor and possibly subsequently a wireless data transmission to a control point is provided.

Embodiments of the present invention are described subsequently with reference to the present FIGS. 1 to 8. There are shown FIG. 1 a cross-section through a copper foil in a first step of a method according to the invention, FIG. 2 in a corresponding representation, a first method step in an alternative embodiment of the method, FIG. 3 a plan view on an expandable circuit carrier produced in the method after a further method step, FIG. 4 again a cross-section through the same circuit carrier after completion of the method steps, FIG. 5 a cross-section through a copper foil in a first method step of a method for producing an expandable circuit carrier in another embodiment of the invention, FIG. 6 in a corresponding representation, the resulting circuit carrier after successive method steps of the same method, FIG. 7 the same resulting circuit carrier after application of an expandable substrate layer and FIG. 8 again a cross-sectional representation of the same resulting expandable circuit carrier after structuring of the copper foil.

An approx. 35 μm thick foil 1 made of copper can be detected in FIG. 1, said foil having been roughened chemically or mechanically in advance on an upper surface 2 and oxidised. For the described method, also other metal foils, for example made of gold or silver, could be used in the same manner. The foil 1 could also be thicker or thinner and in particular have a thickness of 70 μm or 18 μm. The foil 1 is represented in FIG. 1 once (above) before a first method step and once (below) after this method step, during which a starting material 3 which concerns here a thermoplastic polyurethane is applied by means of a knife 4 on the electrically conductive foil 1. After binding of the starting material 3, the latter forms an expandable substrate layer 5 which is connected securely to the foil 1. Instead of the mentioned thermoplastic polyurethane, also other polyurethanes, silicone, rubber or latex and in general those electrically insulating materials which change into an expandable final state after curing can be used as starting material 3. The expandable substrate layer 5 in the present embodiment has a thickness of approx. 35 μm.

The described method step can also be implemented in a modified form. In particular the starting material 3, as represented correspondingly in FIG. 2, can be applied by screen printing on the foil 1 in that it is pressed through a screen 6 with the help of a knife 4, said screen being removed subsequently as illustrated at the bottom in FIG. 2. Finally the starting material 3 can be applied in other embodiments of the method also by casting or lamination on the foil 1 and be connected adhesively to the latter, for example in that the starting material 3 is placed on the conductive foil 1 in the form of powder or in foil form and, for example by means of a roller (by roller lamination), is connected to the conductive foil 1 under the effect of pressure and temperature. According to the composition of the starting material 3, which can also comprise a plurality of components, curing can be triggered by the effect of heat or also chemically in order to form the expandable substrate layer 5.

Figure 3:
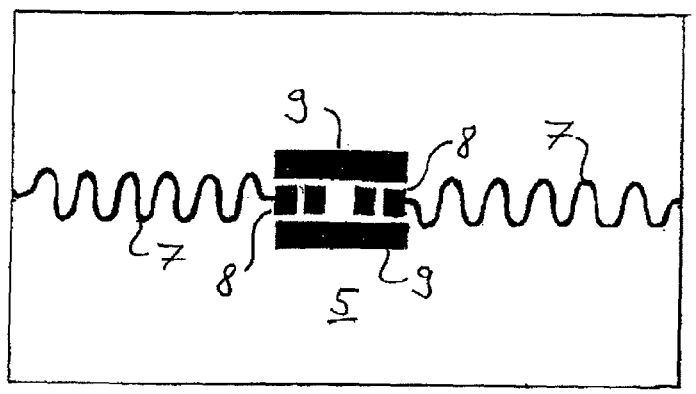

In a further method step, the result of which is represented in FIG. 3 in the form of a plan view on the resulting circuit carrier, the foil 1 is structured by photolithography or by another suitable method such that it forms a conductor structure with expandable strip conductors 7 which are connected respectively to a terminal face 8. Expandability of the strip conductors 7 is thereby achieved in that the latter are formed with a meandering or undulating course and consequently have an excess length, on the basis of which they can be lengthened under tensile tress without breakage. Reinforcing structures 9 which were formed during structuring from the conductive foil 1 and which reinforce the substrate layer and hence the resulting expandable circuit carrier in the vicinity of the terminal faces 8 can likewise be detected. The reinforcing structures 9 are thereby configured as reinforcing faces (reinforcing pads) which are insulated from the strip conductors 7 and the terminal faces 8, said reinforcing faces bridging a spacing between the terminal faces 8 without touching the latter, the two terminal faces 8 being situated between two such reinforcing pads.

Figure 4:
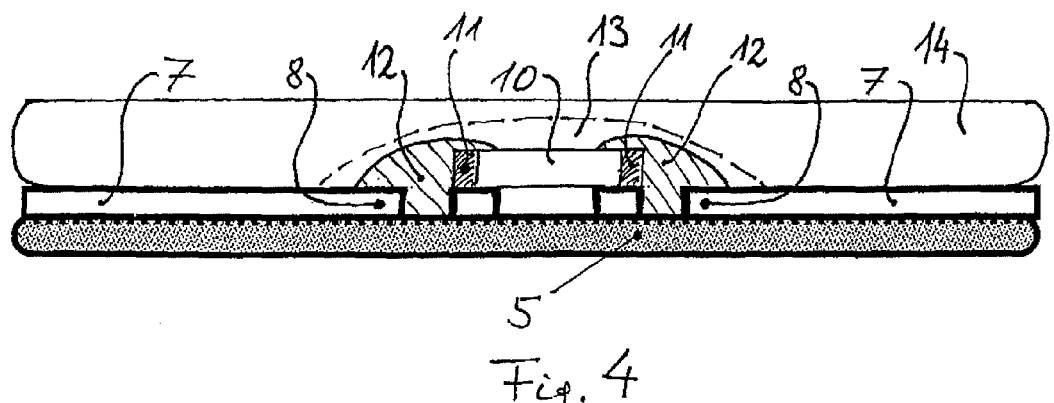

Subsequently, the conductor structure is fitted with an electronic component 10 which can be detected in FIG. 4 and which can concern a sensor, an integrated circuit or a surface-mounted component (SMD). It would be possible to mount this electronic component 10, in a manner known per se, directly on the terminal faces 8, for example with the help of a conductive adhesive. In the present embodiment, the electronic component 10 is however firstly mounted on two additional faces which were left during structuring of the foil 1, after which terminals 11 of the electronic component 10 are connected to the terminal faces 8 by means of a conductive expandable material 12, in the present example a plastic material which is filled with conductive particles or fibres.

Subsequent thereto, the electronic component 10 is surrounded by a further material 13 which concerns a polymer material which is poured over the electronic component 10 and after curing is more rigid than the expandable substrate layer 5. In a last method step, finally a second expandable layer 14 which covers the electronic component 10 and the conductor structure with the strip conductors 7 and the terminal faces 8 is applied, said layer being formed here again from a thermoplastic polyurethane which can be applied at a temperature of at most 130° C. in liquid form without the electronic component 10 and the contactings thereof being destroyed. In contrast, the starting material 3 which is used in the present example has a melting temperature of approx. 200° C. so that also the expandable substrate layer 5 does not run during application of the second expandable layer 14. In the described manner, an expandable circuit carrier is produced, which can expand without difficulty even several times to a length of approx. 150% of an initial length and can relax again to the initial length.

Also in the method illustrated in FIGS. 5 to 8, an expandable circuit carrier is produced, which comprises electronic components 10 and thus forms an autonomous electronic whole system. Recurring features are again provided in FIGS. 5 to 8 with the same reference numbers and have comparable properties unless something different is mentioned expressly.

Figure 5:
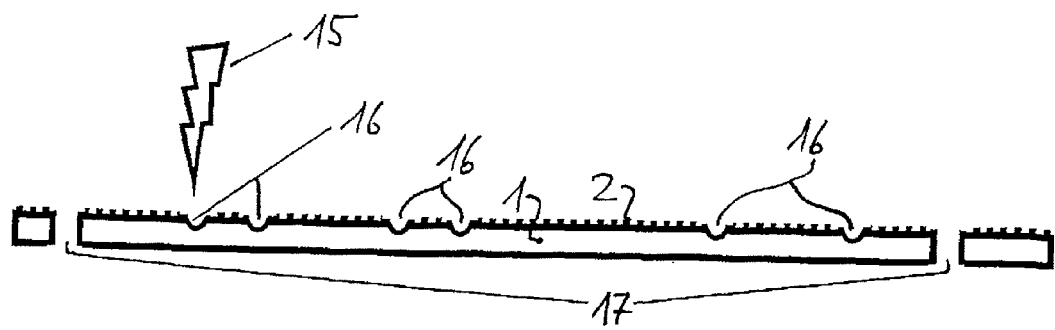
Figure 6:
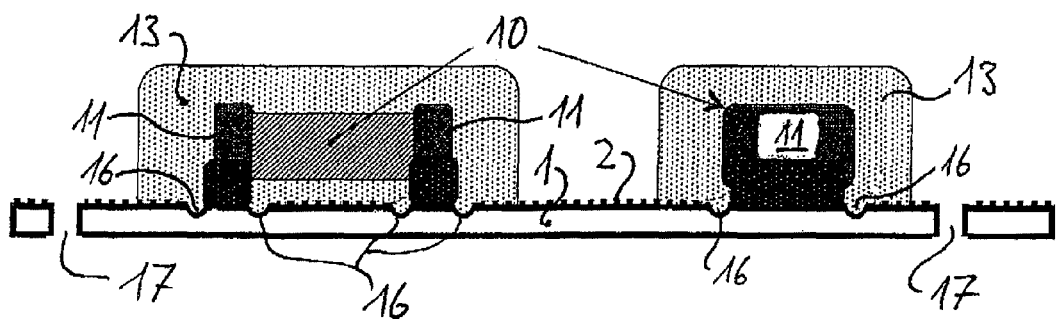
Figure 7:
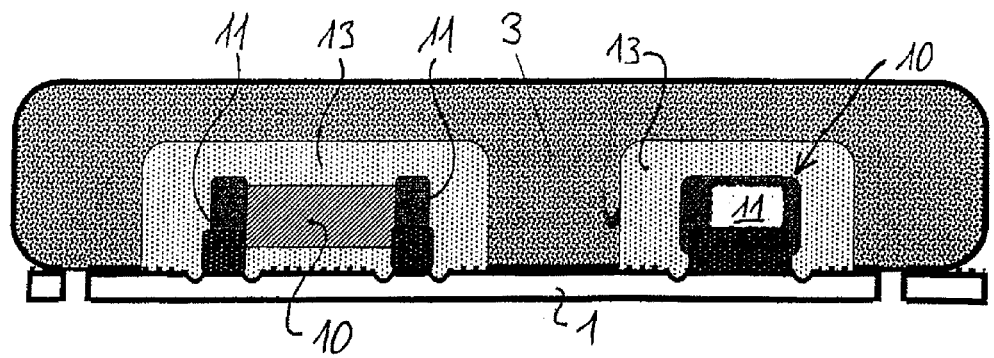

In this method, the foil 1 is provided firstly by the effect of laser radiation 15 with position markings 16, which are provided by recesses, and also with orientation borings 17. This method step is illustrated in FIG. 5. Electronic components 10 which are present here in SMD design are subsequently disposed with terminals 11 on the position markings 16 and hence also in a defined position relative to the orientation borings 17 on the conductive foil 1 and, in the present example, are connected by soldering to the foil 1. Of course, the electronic components 10 can instead also be connected to the foil 1 for example by pressure welding, diffusion bonding or adhesion by means of a conductive adhesive. The electronic components 10 which are thus connected to the foil 1 are then surrounded by a polymer material 13 and consequently also fixed mechanically on the foil 1 in a stable manner.

Subsequently, in a similar manner as described previously with reference to FIGS. 1 and 2, a starting material 3 for an expandable substrate is applied on the foil 1 such that the foil 1 is completely covered and the electronic components 10 are completely embedded.

Thus after curing the starting material 3, an expandable substrate layer 5 which has here a thickness of approx. 100 μm is produced, the material 13 which surrounds the electronic components 10 being more rigid in comparison with this expandable substrate layer 5. The foil 1 now acts again in a manner known per se, i.e. structured for example by lithography, such that it forms a conductor structure with expandable strip conductors 7 and terminal faces 8, the orientation borings 15 serving as orientations in which the strip conductors 7 and the terminal faces 8 which are guided again in a meandering shape are disposed in a defined position relative to the orientation borings 17. In a further development of the method, it would also be conceivable for contacting the electronic components 10 to use again in addition, as illustrated in FIG. 4, a conductive expandable material 12 which connects the terminals 11 of the electronic components 10 to the terminal faces 8 and which could be applied locally before application of the more rigid material 13 or after structuring of the foil 1. In a last method step, a second expandable layer 14, which is illustrated in broken lines in FIG. 8, is now applied again, after which the conductor structure is embedded in an expandable substrate which now encloses the expandable substrate layer 5 and the second expandable layer 14.

Finally, it would also be conceivable to combine the method described with reference to FIGS. 1 to 4 thus with the method described with reference to FIGS. 5 to 8 such that, in the latter, before application of the second expandable layer 14, also again at least one further electronic component 10 is mounted on the conductor structure, on a side of the foil 1 which is orientated away from the expandable substrate layer 5, said component being represented in FIG. 8 with a dotted outline.

Figure 8:
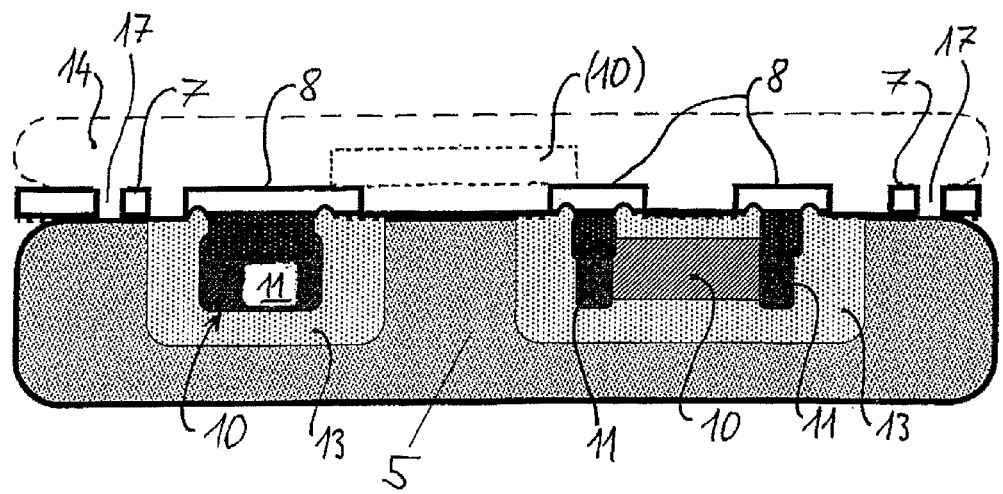

An expandable circuit carrier which can be produced in the described manner is therefore shown in FIG. 8, which can concern for example an autonomous electronic system with sensor function for medical-technological applications.

With the present invention, an advantageously simple method for the production of an expandable circuit carrier is therefore proposed, in which a conductor structure is connected to an expandable substrate layer, the conductor structure being formed such that it comprises expandable strip conductors and also terminal faces, which are connected respectively to one of the expandable strip conductors, for at least one electronic component. A preferred embodiment of the invention thereby provides that, for forming the expandable substrate layer, a starting material for the substrate layer is applied on an electrically conductive foil and is connected to the foil, after which the foil is structured such that it forms the conductor structure, reinforcing structures being structured into the foil in addition and reinforcing the substrate layer in the vicinity of at least two terminal faces without connecting the terminal faces to each other electrically. As a result, an electrical contacting of an electronic component which is mounted on the terminal faces can be prevented in a simple manner from being damaged during expansion or relaxation of the circuit carrier.

A correspondingly advantageous expandable circuit carrier which can be produced with this method comprises an expandable substrate, a conductor structure, which is embedded in the substrate or is disposed on a surface of the substrate, having expandable strip conductors and comprises at least two terminal faces which are connected respectively to one of the strip conductors and also comprises at least one electronic component which has terminals which are connected to the terminal faces in an electrically conductive manner, the conductor structure having reinforcing structures which are situated in one plane with the strip conductors and are formed from the same material as the strip conductors, said reinforcing structure reinforcing the circuit carrier in the vicinity of the terminal faces which are connected to the at least one electronic component without connecting the terminal faces to each other in an electrically conductive manner. The term "circuit carrier" may thereby be understood in a general manner such that it also comprises—here expandable—circuits which have in addition to an expandable printed circuit board electronic components which are mounted or integrated therein.

The invention claimed is:

1. An expandable circuit carrier having an unexpanded length, the expandable circuit carrier comprising an expandable substrate, a conductor structure formed from a structured conductive foil which is at least one of (i) embedded in the substrate and (ii) disposed on a surface of the substrate, the conductor structure having expandable strip conductors and comprising at least two terminal faces which are connected respectively to one of the strip conductors and also comprising at least one electronic component which has terminals which are connected to the terminal faces in an electrically conductive manner, the conductor structure having reinforcing structures which reinforce the circuit carrier in the vicinity of the terminal faces which are connected to the at least one electronic component without connecting the terminal faces to each other in an electrically conductive manner, wherein the reinforcing structures, the strip conductors and the terminal faces are formed from the same structured conductive foil, the expandable circuit carrier being expandable by at least 10 percent of said unexpanded length.

2. The expandable circuit according to claim 1, wherein the expandable circuit carrier is characterized by at least one of the following:
   the at least one electronic component being surrounded by a material which connects the at least one electronic component mechanically to the conductor structure and is more rigid than a material which forms the expandable substrate; and
   at least one of the terminals of the at least one electronic component being connected by means of a conductive expandable material to the corresponding terminal face.

3. An expandable circuit carrier having an unexpanded length, the expandable circuit carrier comprising an expandable substrate, a conductor structure formed from a structured conductive foil which is at least one of (i) embedded in the substrate and (ii) disposed on a surface of the substrate, the conductor structure having expandable strip conductors and comprising at least two terminal faces which are connected respectively to one of the strip conductors and also comprising at least one electronic component which has terminals which are connected to the terminal faces in an electrically conductive manner, the conductor structure having reinforcing structures which reinforce the circuit carrier in the vicinity of the terminal faces which are connected to the at least one electronic component without connecting the terminal faces to each other in an electrically conductive manner, wherein the reinforcing structures, the strip conductors and the terminal faces are formed from the same structured conductive foil and wherein the expandable circuit carrier is produced by a method in which a starting material for the expandable substrate is applied on an electrically conductive foil, said starting material forming an expandable substrate layer which is connected to the foil, after which the foil is structured such that the foil forms the conductor structure, the expandable circuit carrier being expandable by at least 10 percent of said unexpanded length.

4. The expandable circuit according to claim 3, wherein the expandable circuit carrier is characterized by at least one of the following:
   the at least one electronic component being surrounded by a material which connects the at least one electronic component mechanically to the conductor structure and is more rigid than a material which forms the expandable substrate; and
   at least one of the terminals of the at least one electronic component being connected by means of a conductive expandable material to the corresponding terminal face.

* * * * *